United States Patent [19]

Bhagat

[11] Patent Number: 4,528,211

[45] Date of Patent: Jul. 9, 1985

[54] SILICON NITRIDE FORMATION AND USE IN SELF-ALIGNED SEMICONDUCTOR DEVICE MANUFACTURING METHOD

[75] Inventor: Jayant K. Bhagat, Troy, Mich.

[73] Assignee: General Motors Corporation, Detroit, Mich.

[21] Appl. No.: 548,712

[22] Filed: Nov. 4, 1983

[51] Int. Cl.³ .......................................... H01L 21/318
[52] U.S. Cl. ....................................... 427/88; 156/653; 156/657; 156/664; 204/192 E; 204/192 EC; 29/571; 29/576 W; 427/89; 427/94; 427/85
[58] Field of Search ....................... 427/94, 88, 89, 85; 204/192 E, 192 EC; 156/653, 657, 664; 29/571, 576 W

[56] References Cited

U.S. PATENT DOCUMENTS

| | | | |
|---|---|---|---|
| 3,597,667 | 8/1971 | Horn | 148/187 |
| 3,707,656 | 12/1972 | DeWitt | |
| 3,745,429 | 7/1973 | Misawa | |
| 3,922,710 | 11/1975 | Koike | 357/54 |
| 4,103,415 | 8/1978 | Hayes | 29/571 |
| 4,113,515 | 9/1978 | Kooi | 427/94 |
| 4,136,434 | 1/1979 | Thibault | 29/571 |
| 4,273,805 | 6/1981 | Dawson | 427/88 |
| 4,299,862 | 11/1981 | Donley | 427/94 |
| 4,349,584 | 9/1982 | Flatley | 427/89 |
| 4,353,936 | 10/1982 | Nozaki | 427/94 |
| 4,411,929 | 10/1983 | Sato | 427/94 |

OTHER PUBLICATIONS

Chiu et al., "Low Energy Implantation into Silicon ...", J. Electrochem. Soc.: Solid State Science and Technology, Feb. 1982, pp. 408-412, vol. 129, No. 2.

Primary Examiner—John D. Smith
Attorney, Agent, or Firm—Robert J. Wallace

[57] ABSTRACT

A method of forming a silicon nitride coating in situ on a silicon surface by ion milling. The ion milling and silicon nitride formation process are uniquely integrated in semiconductor manufacturing methods to provide several benefits, including contact areas being substantially registered with and self-aligned with functional regions.

3 Claims, 3 Drawing Figures

SILICON NITRIDE FORMATION AND USE IN SELF-ALIGNED SEMICONDUCTOR DEVICE MANUFACTURING METHOD

FIELD OF THE INVENTION

This invention relates to a method of forming silicon nitride on a silicon surface and to make semiconductor devices. It more specifically involves distinctively heat treating a nitrogen ion beam milled silicon surface to make that surface highly oxidation resistant, and integrating such a heat treatment in a semiconductor device manufacturing method to produce self-aligned features.

BACKGROUND OF THE INVENTION

It is known to use silicon nitride films in the manufacture of semiconductor devices, such as insulated gate field effect transistors, i.e. IGFETs. Silicon nitride films are etch-resistant to silicon oxide etchants and are oxidation-resistant. They are used as etch masks, oxidation masks, passivating coatings and simply protective coatings. It is even known to form silicon nitride in situ by exposure of a silicon surface to ammonia, and to use a technique in semiconductive device manufacture. Self-alignment is a desirable feature in a semiconductor method because it eliminates a critical masking step. Self-alignment thus permits closer feature spacing and/or smaller geometries to be used. Accordingly, denser integrated circuits can be made.

Ion beam milling is sputter etching technique that is of increasing interest in manufacturing dense IGFET integrated circuits. It offers extreme etching precision. It is also known that ion beam milling will concurrently shallowly implant ions into the surface being etched. I have found that if nitrogen ions are used in ion beam milling silicon for a sufficient duration, and if the silicon is properly annealed, an extremely thin but very useful film of silicon nitride will be formed on the silicon surface. Even though the film is quite thin, e.g. about 100 angstroms or less, when properly annealed it is so etch-resistant and oxidation-resistant that it is quite useful in semiconductor device processing. Proper anneal means heat treatment in a nonoxidizing atmosphere, such as nitrogen, before heat treatment in any oxidizing atmosphere. This type of anneal can readily be done as a preliminary phase of any subsequent oxidizing heat treatment normally used in the manufacture of a semiconductor device.

I have found that I can incorporate nitrogen ion beam milling and my distinctive anneal at various stages of integrated circuit fabrication, to permit the nitrogen ion beam milling to perform functions in addition to milling. For example, it can form an etch stop and/or an oxidation mask, depending on how it is integrated in the fabrication process.

Still further, I have found how to integrate ion beam milling and the distinctive nonoxidizing anneal atmosphere without adding any significant steps to the fabrication process. In fact, by integrating this technique in the wafer fabrication the number of steps, even critical masking steps, can be reduced. For example, a separate silicon nitride deposition process is not needed. Self-alignment of the silicon nitride produced features is obtained, which reduces critical masking steps. In this latter connection, self-aligned contact windows can be produced. Further, I have found that I can now readily reflow a phosphosilicate glass overcoat on the surface of a monolithic integrated circuit after etching a contact window in the glass, without concurrently reforming thermal oxide in the window. Thus, a critical remasking step to remove it is not needed. I can even use these concepts to reduce electrical shorts between the gate electrode and source or drain electrodes, as will hereinafter become more apparent.

OBJECTS AND SUMMARY OF THE INVENTION

It is an object of this invention to provide a method of forming an oxidation-resistant silicon nitride coating in situ on a silicon surface while forming a semiconductive device on that surface.

Another object of the invention is to provide an improved method of making monolithic integrated circuits on a silicon wafer, which method includes forming an oxidation-resistant layer of silicon nitride in situ on that wafer without adding significant process steps to the method.

A further object of the invention is to provide a new self-aligned method of making insulated gate field effect transistors, especially for integrated circuits.

A still further object of the invention is to provide an improved method that permits the reflow of a phosphosilicate glass layer after a contact window is opened in it, without concurrently thermally regrowing silicon dioxide within the contact window.

In this invention, a silicon surface is nitrogen ion beam milled, preferably as a continuing step when milling away an overlying silicon oxide layer, for a sufficient duration to form a continuous layer of implanted nitrogen about 100 angstroms deep. The silicon surface is then heated in a nonoxidizing atmosphere, such as of substantially pure nitrogen, for a sufficient duration to produce an extremely dense, etch-resistant and oxidation-resistant silicon nitride film on the silicon surface. By etch-resistant, I mean it is resistant to attack by those substances that readily attack silicon oxide. The nonoxidizing heat treatment must be performed before the implanted silicon surface is exposed to oxidizing atmospheres at elevated temperatures. On the other hand, it can be performed while heating a substrate up to a temperature used for oxidation, by simply using nitrogen gas during the warm-up, instead of air or oxygen. This invention contemplates integrating such a procedure into an integrated circuit manufacturing process in several novel ways hereinafter described in detail.

BRIEF DESCRIPTION OF THE DRAWING

Other objects, features and advantages of the invention will become more apparent from the following description of preferred examples thereof and from the drawing, in which.

DESCRIPTION OF THE PREFERRED EMBODIMENTS

Figure 1:
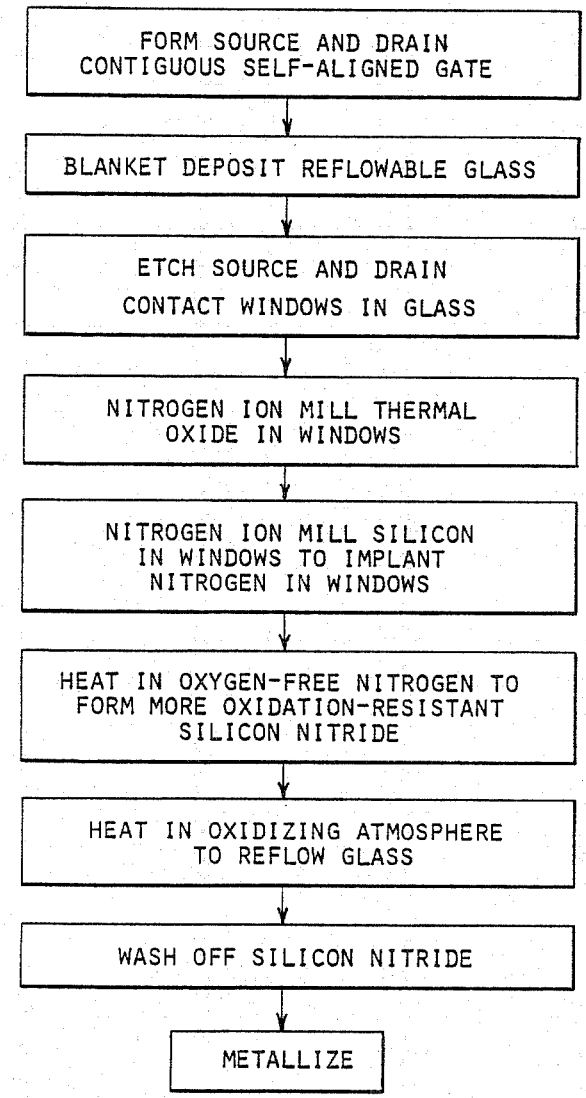
FIGS. 1-3 illustrate sequences of major steps in different examples of methods of making semiconductor devices in accordance with this invention.

As hereinbefore indicated, this invention involves using ion beam milling in a new way in semiconductor device processing. By ion beam milling, I mean the known gentle etching process that is a specific form of sputtering which is already of increasing interest in integrated circuit manufacture. In ion beam milling, a collimated beam of low energy ions is targeted directly on the workpiece. The ion beam energy, charge, density and angle of incidence are controlled to remove atoms from the workpiece surface by transfer of momentum. Hence, it is sputtered away. In this invention any commercially available ion milling equipment can be used without modification. In such equipment, ions are produced in a vacuum discharge chamber by an electrical discharge between an electron emitting cathode and a surrounding anode at a voltage of up to about 2000 volts. A nonoxidizing atmosphere of argon, nitrogen, etc., is typically used in the vacuum chamber, at a pressure of the order of $1 \times 10^{-3}$ to $1 \times 10^{-6}$ torr at a current density of about 1 ma/cm$^2$ or less. In substance, this treatment accelerates the ions to the surface being milled at an energy of up to about 2 keV. The ions are accelerated into a vacuum work chamber through collimating grids and a beam neutralizing filament. The collimated ions form a beam that impinges on the workpiece that is normally disposed on a water cooled support. With beam current and ion energy independently adjustable over a broad range of values, etching rates of up to about 300 angstroms per minute can be obtained.

I have recognized that the collimated ion beam of nitrogen ions more than just etches when milling a silicon the surface being milled. If the beam is of nitrogen ions and the surface being etched is silicon, nitrogen ions are implanted to a depth of about 100 angstroms. I have also recognized that after about only about 0.2–5 minutes of etching silicon, a sufficient dose of nitrogen is implanted in the silicon surface to form a continuous film of silicon nitride. However, in that amount of time little etching actually takes place. Hence, by only slightly overetching, when etching a thermal oxide film away from a silicon surface, one can concurrently implant nitrogen into the silicon surface. While the resultant silicon nitride film is somewhat resistant to etching and/or oxidation as-formed, I have found that this film becomes decidedly more so if it is heated in a nonoxidizing atmosphere for a few minutes before heating it in an oxidizing atmosphere. In fact, after heating in nitrogen, the resultant silicon nitride film is so resistant to oxidation that it is useful as an oxidation mask. I have found it useful at various stages in the manufacture of semiconductor devices, even for self-aligned contacts and electrical short protection. Such a film can apparently even be used as an oxide mask when growing a field oxide around device mesas in an IGFET integrated circuit. It is also useful as an etch stop, or mask.

The milling time needed to produce a sufficient dose of nitrogen implant will, of course, vary depending on the beam current used during milling and the purpose for which the resultant silicon nitride film is to be used. For example, if the film is to be used as a field oxidation mask, the milling time will have to be longer than when the film is to be used as an etch stop.

About 0.2–5 minutes of milling time will generally form a useful film when milling is performed at the usual current density. The usual current density is at about 0.5 to 5 ma/cm$^2$ of area being etched. When ion beam milling away a silicon oxide film overlying the silicon surface, some of this implantation time actually occurs during the period in which the last atomic layers of the overlying film are being milled away. Hence, one will probably not have to continue milling into the silicon surface, after it is exposed, for the full 5 minutes referred to above. Instead, one may choose to continue milling the exposed silicon only about 0.5–2 minutes. Additional milling time is not objectionable from a silicon nitride formation standpoint. Of course, if too much of the silicon surface is removed, an objectionable step can be formed on the silicon surface.

As hereinbefore mentioned, by appropriately integrating nitrogen ion beam milling and a nonoxidizing anneal into a semiconductor manufacturing process, an improved process can be produced that provides special benefits. One such method is illustrated in FIG. 1.

In the FIG. 1 method, a p-type surface portion of a monocrystalline silicon body is thermally oxidized to form a thin, continuous, i.e. blanket layer of silicon dioxide suitable for use in a gate dielectric layer in an IGFET. Such a layer is ordinarily less than 1000 angstroms and thus conveniently etchable by ion milling. As usual for IGFET gate insulator layers, it is of high purity. Oxidation to form this layer is thus performed in the usual manner, as are all of the steps described herein, unless otherwise stated. A blanket n-type polycrystalline silicon coating of usual thickness is then formed on the gate dielectric layer and then patterned to form a gate electrode. N-type source and drain regions are then formed in the silicon surface, contiguous the gate electrode. The source and drain regions can be formed by a phosphorus implantation through the thermal oxide. In the alternative, they could be formed by phosphorus ion diffusion through openings etched in the thermal oxide. In this latter instance, the thermal oxide would be regrown in the openings during diffusant drive-in.

A blanket coating of phosphosilicate glass, or other reflowable glass, is then deposited over the entire surface portion of the silicon body as thus far prepared. The glass coating is then appropriately masked and contact windows are photoetched in the glass coating over the source and drain regions, respectively. This exposes the thermal oxide covering these regions. Without remasking, or necessarily even removing the mask used for etching the contact windows in the phosphosilicate glass coating, the silicon body is exposed to nitrogen ion beam milling in the normal and accepted manner. The nitrogen ion beam milling is continued for sufficient duration to erode away the entire thickness of the thermal oxide film exposed in the contact windows. Masking is actually not necessary during the nitrogen ion beam milling even though the phosphosilicate glass coating etches at about the same rate as the thermal oxide film. The reason for this is that the phosphosilicate glass coating is several orders of thickness greater than that of the thermal oxide film. The proportion of it eroded away during the time needed to completely erode away the thermal oxide film is not significant. It can thus be seen that precise contact windows can be opened with only one masking. A second mask is not needed to penetrate the thermal oxide. Hence, the yield loss and device size increase attendant the remasking is avoided. Included among these benefits is that inadvertent lateral etching of the glass is at least reduced, if not avoided completely.

Even after the thermal oxide film has been removed from the contact windows and bare silicon exposed, nitrogen ion beam milling is continued, preferably for about another 0.2–5 minutes. As previously mentioned, this continued etching of the underlying silicon surface, implants nitrogen atoms into it. Perhaps only 0.5–2 additional minutes of etching the exposed silicon areas may be needed to form a continuous implanted film. In most instances it is not desirable to etch the exposed silicon surface for more than about 15 minutes, or an undesirable step in the silicon surface will be produced. However, it should be understood that there may be some situations where it might be permissible. In any event, the ion beam milling implants nitrogen 100 Å deep into the as-etched surface.

The silicon body is then heated in a nonoxidizing atmosphere, preferably of substantially oxygen-free nitrogen, to form a highly oxidation-resistant and etch-resistant silicon nitride film on the freshly etched silicon surface. By substantially oxygen-free nitrogen, I mean a nitrogen containing less than about 0.01% by volume oxygen. The heating should be for at least about 10 minutes at temperatures in excess of about 900° C. In general, heating in a nonoxidizing atmosphere for about 10-20 minutes at about 900°-1150° C. can be used. This heating can comprise the initial steps in the immediately successive oxidizing treatment used to densify and/or reflow the phosphosilicate glass coating.

In the last-mentioned instance, reflow of the phosphosilicate glass coating is produced by simply changing the nitrogen heat treatment atmosphere to moist oxygen after the silicon nitride anneal, and maintaining the temperature at about 1000°-1100° C. for about 10-25 minutes. The annealed silicon nitride film prevents a thermal oxide from reforming within the contact windows. Since this film can be readily selectively etched away, no critical masking step need be used to remove it. In addition, if any gate electrode portions were exposed when forming the source and drain regions by diffusion, they were recovered with thermal oxide during diffusant drive-in. Such portions are not uncovered again when the silicon nitride is removed. Hence, some added protection against electrical shorts between the gate electrode and the source or drain electrodes is obtained.

By way of example, concentrated orthophosphoric acid can be used as a selective etchant for wet chemical etching of silicon nitride. Carbon tetrafluoride produces a somewhat selective means for plasma etching of silicon nitride in that it etches silicon nitride about five times faster than it does silicon oxide. However, plasma etching with sulfur hexafluoride containing about 10-20% by volume argon etches silicon nitride more than ten times as fast as it does silicon oxide, and is preferred.

The silicon body is then metallized in a normal and accepted manner, as for example, evaporation of a blanket aluminum layer onto the glass coating and subsequently photoetching into a predetermined conductor pattern. If desired, a protective layer can be deposited onto the metallization layer. The particular metallization procedures and protective overlay procedures used are not important to this invention. Accordingly, any of the normal and accepted techniques can be used.

The method of FIG. 1 provides a technique for producing source and drain contact windows with only one masking step after depositing the reflowable glass coating. In addition, the phosphosilicate glass coating can be reflowed after contact window opening without also requiring a significant prior additional step or a subsequent significant step. These same advantages are obtained with the method illustrated in FIG. 2. However, in addition, the method of FIG. 2 permits one to concurrently also make electrical contact to the gate electrode. On the other hand, when simultaneously making contact to the gate electrode an additional layer of silicon dioxide must be formed on the surface of the polycrystalline silicon.

Figure 2:
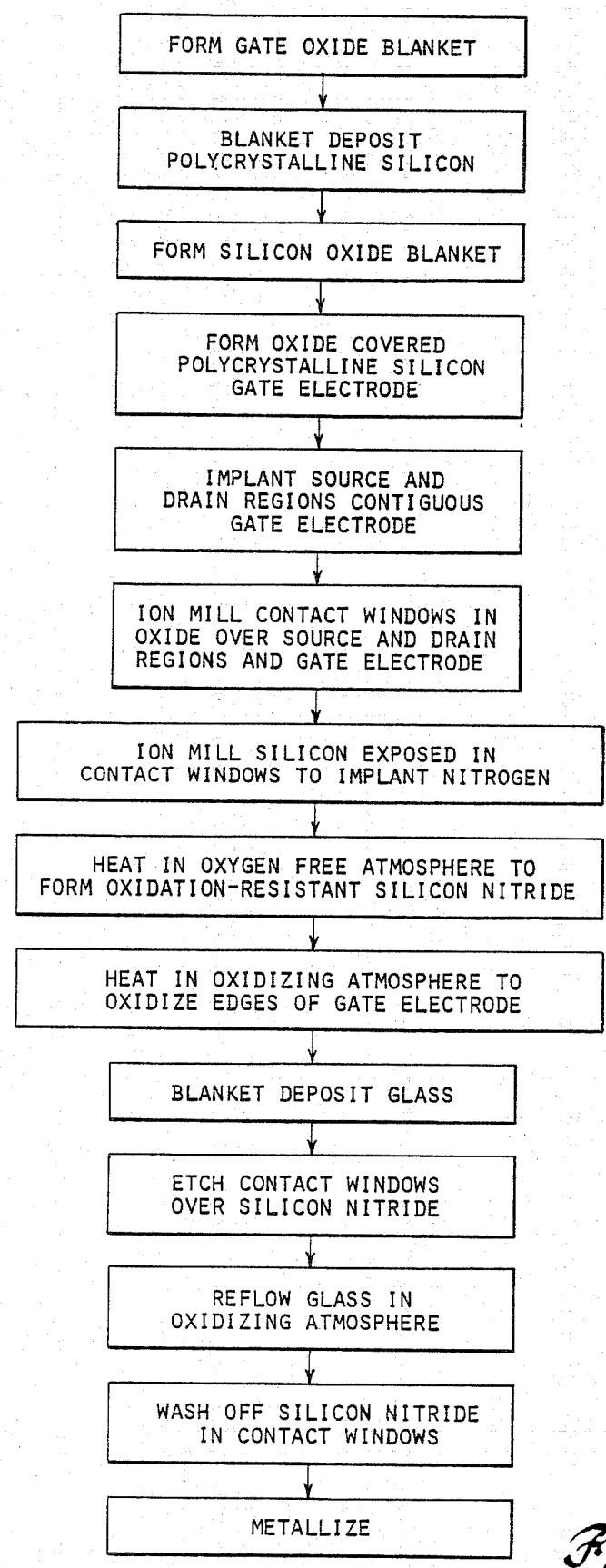

The method of FIG. 2 also differs from the method of FIG. 1 in that the FIG. 2 method includes an additional oxidation step to provide enhanced protection against electrical shorts between the gate electrode and its adjacent source or drain electrodes. It should also be noted that in the FIG. 2 method the silicon nitride film is formed before the phosphosilicate glass is deposited, not afterwards.

More specifically, the FIG. 2 process involves forming a thin gate dielectric blanket layer for an IGFET on a p-type surface portion of a monocrystalline silicon body. An n-type blanket layer of polycrystalline silicon is then formed on the gate dielectric layer. A silicon dioxide blanket layer is then formed on top of the polycrystalline silicon layer. In addition, the FIG. 2 method illustrates how this invention can also be concurrently used in making electrical contact to the gate electrode too.

I recognize that in the FIG. 2 method, an extra step of silicon oxide formation on top of the gate electrode is required. However, I believe that the extra protection obtained against electrical shorts from the gate electrode to the source or drain electrodes offsets the disadvantage of including the extra step. The extra protection is obtained by providing an oxidizing treatment before the phosphosilicate glass coating is deposited, to oxidize gate electrode edges after silicon nitride coated contact areas are formed prior to phosphosilicate glass deposition.

In a specific description of the method of FIG. 2, an IGFET integrated circuit is made by forming a first blanket silicon dioxide layer on the surface of a silicon wafer. This first blanket silicon dioxide layer can be formed by thermal oxidation. It is of the usual IGFET gate insulator thickness and quality. If desired, the silicon wafer can be selectively oxidized in a prior step to form a field oxide of ordinary thickness around discrete island areas wafer surface where IGFETs are to be formed. In such instance the gate insulator layer would cover these discrete silicon islands and the islands would be surrounded by a thicker field oxide layer.

A blanket layer of polycrystalline silicon of the usual thickness is then formed on the oxide, covering at least the islands. The polycrystalline silicon layer is doped to n-type conductivity, either as deposited as in a separate operation thereafter. In either event, it is covered with a second blanket layer of silicon oxide. Neither purity nor method of formation of this second blanket silicon oxide layer is particularly critical. Its thickness is not intrinsically critical either. On the other hand, its thickness should be matched to that of the first silicon oxide layer, so that they both will be etched away in about the same amount of time by the same etchant. If the first and second oxide layers etch at different rates, they should then be of correspondingly different thicknesses. Nevertheless, their thicknesses would still be considered as being matched. All the same, I believe it is preferred that both the first and second blanket oxide layers have the same response to an etchant.

The second silicon dioxide layer and the polycrystalline silicon layer are then photoetched to delineate gate electrode patterns on the gate oxide covered islands on the silicon wafer. The silicon wafer is then given a blanket n-type, implant, to produce source and drain regions contiguous opposite edges of each gate electrode or each island. The gate oxide on the islands is not removed to perform the implant. The wafer surface is then masked so as to leave exposed only electrical contact areas, including a gate electrode contact area as well as contact areas for the source and drain regions.

The first silicon oxide layer covering the contact areas on the source and drain regions and the second silicon oxide layer covering the contact area on the gate electrode of each island are then removed by nitrogen ion beam milling in the manner hereinbefore described. The milling opens contact windows in both the first and second silicon oxide layers over the respective contact areas. After the contact windows are opened, the nitrogen ion beam milling is continued for 0.5–2 additional minutes. This implants nitrogen 100 angstroms deep into the polycrystalline silicon exposed within the gate contact window and 100 angstroms deep into the monocrystalline silicon exposed within the source and drain contact windows.

The mask is then removed and the silicon wafer heated in a substantially oxygen-free nitrogen atmosphere for about 10–20 minutes at about 900°–1150° C. This anneal that forms a dense, oxidation-resistant film of silicon nitride on at least the silicon surface portions parallel the major surface of the wafer that are exposed in each contact window. The silicon wafer is then heated in moist oxygen to oxidize silicon edges, particularly those of the gate electrode. Accordingly, as in the FIG. 1 method, the contact areas are protected from oxidation by a thin silicon nitride overlayer formed by nonoxidizing anneal after nitrogen ion beam milling.

A blanket coating of phosphosilicate glass, or other reflowable glass, is then formed over the entire surface of the silicon wafer as thus far prepared. Contact windows are then etched into the phosphosilicate glass over and wholly within the periphery of the silicon nitride covered contact areas. The silicon wafer is then heated to reflow the phosphosilicate glass, with the respective contact areas being protected by their covering silicon nitride films.

The silicon wafer is then exposed to an etchant selective to silicon nitride without remasking, or at least without a critical remasking. This exposure to the etchant washes off the silicon nitride exposed within the contact windows in the glass coating. After the silicon nitride is washed off, the silicon wafer is metallized in the usual way to produce a metallization pattern that includes source, drain and gate electrical contacts. Since the edges of the gate electrode were previously oxidized, electrical shorts between the source or drain contacts and the gate electrode are minimized.

The advantages in contact formation hereinbefore described in connection with FIG. 2 are also available in the method illustrated in FIG. 3. The FIG. 3 method, however, differs in that it proposes applying the phosphosilicate glass before delineating the gate electrode or its contact area or forming source and drain regions. I also recite in FIG. 3 that the IGFET is being formed on a mesa of the silicon wafer. This recitation is intended for purposes of further illustration, not for purposes of limiting the invention. Also, the gate electrode contact window is separately opened before the source and drain contact areas are opened. As in the FIG. 2 method, extra steps are used in this particular example of the invention. However, I believe they produce added benefits that offset the disadvantage of having to perform the extra steps. For example, a separate ion milling operation and heat treatment is used for the gate electrode contact area. However, it allows considerable edge oxidation of the gate electrode before the source and drain regions are formed. This gives greater insurance against source or drain contacts electrically shorting to the gate electrode. In those situations where the gate contact definition is not critical or where large gate contacts are to be used, gate contact definition need not be done by ion milling. It can be done conventionally.

In addition, a thicker edge oxide on the polycrystalline silicon gate electrode will shadow the source-drain implantation that is subsequently performed. Thus, an additional anneal time may be needed for increased lateral diffusion of the source and drain dopants beneath the oxidized edges of the gate electrode. On the other hand, I believe this provides an ancillary advantage. It appears that during oxidation at the edge of the polycrystalline silicon gate, boron concentration in the underlying p-type monocrystalline silicon is reduced. This may be due to segregation effects, relative diffusion effects and/or even relative rates of oxidation to diffusion. In any event, the net boron concentration under the oxidized edges of the gate electrode is reduced to about 0.2 times its concentration under the unoxidized portions of the polycrystalline silicon gate. Thus, these end regions, though not under the control of the remaining polycrystalline silicon gate, become n-type anyway because of the effect of the oxide and interface charges and a lateral diffusion gradient of implanted n-type dopant. The net result appears as a graded junction contiguous the gate electrode edge in each of the source and drain regions. By graded junction I mean that there is gradient in majority current carrier concentration, i.e. effective doping, of the source or drain region parallel to the surface of the silicon body and extending into the source or drain region from the pn junction that separates the source or drain region from the IGFET channel. A graded junction in the drain region is most important. It permits one to use narrower channel widths without correspondingly dropping source-drain operating voltage but still avoiding punch through. By punch through, I mean that the space charge region of the reverse biased drain channel pn junction extends into the source region.

Figure 3:
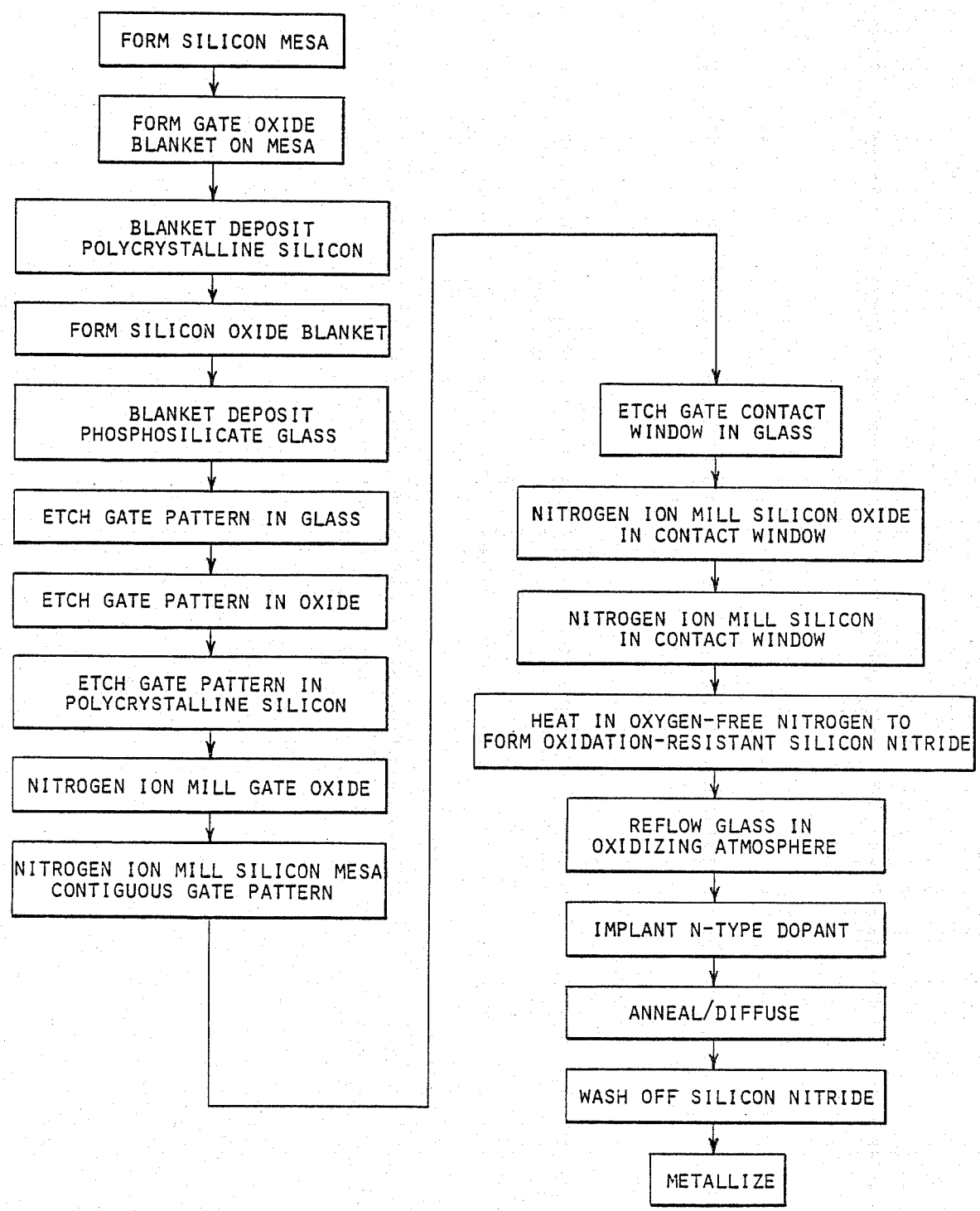

An advantage to the FIG. 3 process that should be emphasized is that the source and drain regions are formed late in the fabrication process. Since only an annealing or shallow diffusion of source and drain region dopants is needed and no further high temperature step follows, the side diffusion of these dopants is dramatically reduced. Precise channel length and width is thus preserved. It should analogously be recognized that these regions are formed from the same glass window used to make contacts to these regions. Accordingly, the FIG. 3 process eliminates a contact mask tolerance as well. Hence, higher density integrated circuits can be fabricated. Further, if this process is used to make a memory matrix of IGFETs in an integrated circuit, late programming is possible by simply changing the source-drain implantation mask to add or delete drain regions in the memory matrix.

I wish to also note that the gate electrode contacts need not be opened before the glass is reflowed. Usually such contacts are large and few in a large scale integrated circuit. Making such a contact is not especially critical. Hence, for example, in FIG. 3 the gate contact windows can be opened immediately after glass reflow or immediately after washing off the silicon nitride from over the source and drain regions. In addition, one might choose to open the gate windows by plasma or wet chemical etching, instead of ion milling.

It should also be mentioned that the monocrystalline silicon mesa originally formed in the first step of the FIG. 3 method is ordinarily formed by selectively covering island-like portions of the silicon surface with silicon nitride, and then extensively oxidizing the surrounding surface. It is not necessary that one use a special and separate apparatus to deposit a silicon nitride film to produce the silicon nitride oxidation mask. One could use nitrogen ion beam milling and a nitrogen anneal to form the silicon nitride covered islands where the mesas are to be formed.

The embodiments of the invention in which an exclusive property or privilege is claimed are defined as follows:

1. A new method of forming and using a silicon nitride coating on a silicon surface portion comprising the steps of coating a silicon surface part with a layer of silicon oxide prior to heating the silicon body in an oxidizing atmosphere, wet or dry etching a window area in the silicon oxide layer over a selected portion of the silicon surface to at least thin it enough to be useful as a mask, ion milling the silicon oxide layer for at least about 20 seconds with nitrogen ions to remove any residual silicon oxide in the window area and to coincidentally implant nitrogen atoms in an ion milled silicon surface portion to a depth of up to about 100 angstroms using silicon oxide layer portions outside the window area as a mask, heating the ion milled silicon surface portion in an atmosphere consisting essentially of nitrogen, effective to produce a silicon nitride coating on the milled silicon surface portion that is useful in preventing the silicon surface portion exposed in the window area from oxidizing when other portions of the silicon surface are oxidized, then heating the silicon body in an oxidizing atmosphere, and thereafter selectively removing the silicon nitride coating by means of an etchant that preferentially attacks silicon nitride rather than silicon oxide.

2. A new method of forming and using a silicon nitride coating on a silicon surface portion comprising the steps of forming a coating of a first silicon oxide layer on a silicon surface part, forming a coating of a second silicon oxide layer that is etched more rapidly than the first silicon oxide layer by a given etchant, etching a window in the second silicon oxide layer using the given etchant, terminating the etching before the first silicon oxide layer is significantly etched, ion milling the first silicon oxide layer with nitrogen ions without critical re-masking to expose a silicon surface portion within the window, continuing ion milling with nitrogen ions for about 20-50 seconds to form a layer of implanted nitrogen atoms up to a depth of about 100 angstroms in the exposed silicon surface portion, heating the silicon surface portion in an atmosphere consisting essentially of nitrogen before the surface portion is heated in any other atmosphere, to form a silicon nitride coating in situ on the milled silicon surface portion, exposing the resultant product to an oxidizing atmosphere, and then selectively etching away the silicon nitride coating without critical re-masking.

3. A method of making an electrode on an electrical contact area of a silicon semiconductor region through a reflowable and rapidly etchable silicon oxide layer, that permits reflow of the layer after etching of a contact window in it without reforming silicon oxide in the contact window during reflow, and comprising the steps of etching a contact window in the reflowable and rapidly etchable silicon oxide layer, subjecting the window to milling by means of nitrogen ions for sufficient duration to not only remove any residual silicon oxide that may be on the contact area within the window but to also implant nitrogen atoms into the contact area to a depth of about 100 angstroms, heating the contact area in an atmosphere consisting essentially of nitrogen to produce a silicon nitride coating in situ that is capable of protecting the contact area from oxidation during succeeding process steps, reflowing the silicon oxide layer in an oxidizing atmosphere, etching away the silicon nitride coating with a selective etchant, forming a blanket layer of metal on the reflowable layer and the contact area, masking the metal layer in accordance with a predetermined pattern, and etching exposed metal away to delineate a metallization pattern on the reflowable layer and the contact area.

* * * * *